(12) United States Patent
Horii

(10) Patent No.: US 12,193,185 B2
(45) Date of Patent: Jan. 7, 2025

(54) DEVICE MOUNTING MECHANISM AND DEVICE MOUNTING METHOD FOR RACK MOUNT

(71) Applicant: NEC Platforms, Ltd., Kawasaki (JP)

(72) Inventor: Yuji Horii, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 18/235,006

(22) Filed: Aug. 17, 2023

(65) Prior Publication Data

US 2024/0074086 A1    Feb. 29, 2024

(30) Foreign Application Priority Data

Aug. 23, 2022 (JP) ................. 2022-132228

(51) Int. Cl.
*H05K 7/18* (2006.01)
*H05K 7/14* (2006.01)

(52) U.S. Cl.
CPC ........... *H05K 7/183* (2013.01); *H05K 7/1417* (2013.01)

(58) Field of Classification Search
CPC .......... H05K 7/18; H05K 7/183; H05K 7/186; H05K 7/1417
See application file for complete search history.

(56) References Cited

U.S. PATENT DOCUMENTS

| | | | | |
|---|---|---|---|---|
| 5,169,221 A * | 12/1992 | Wheeler | ................. | H05K 7/16 248/299.1 |
| 7,472,795 B2 * | 1/2009 | Dubon | ................... | H02G 3/128 211/26 |
| 7,554,819 B2 * | 6/2009 | Chen | ..................... | H05K 7/1491 361/756 |
| 7,712,615 B2 * | 5/2010 | Chen | ..................... | H05K 7/1491 211/187 |
| 8,045,343 B2 * | 10/2011 | Fan | ...................... | H05K 7/1491 361/825 |
| 8,231,014 B2 * | 7/2012 | Chen | ..................... | H02G 11/00 211/175 |
| 8,251,321 B2 * | 8/2012 | Chen | ..................... | H02G 3/0456 312/273 |
| 8,387,933 B2 * | 3/2013 | Yu | ........................ | H05K 7/1491 248/220.22 |
| 9,480,182 B2 * | 10/2016 | Chen | ..................... | H05K 7/1491 |
| 9,689,510 B1 * | 6/2017 | Chang | ..................... | H05K 7/18 |

(Continued)

FOREIGN PATENT DOCUMENTS

FR    1332718 A  *  7/1963
JP    2021-129055 A    9/2021

*Primary Examiner* — Stanton L Krycinski
(74) *Attorney, Agent, or Firm* — Sughrue Mion, PLLC

(57) ABSTRACT

A device mounting mechanism that loads a device into an internal space within a plurality of columns constituting a rack mount includes: a pair of columns provided parallel to each other; mounters respectively supported by the pair of columns so as to be movable in a direction intersecting a plane containing these columns; and a mount bar supported substantially horizontally by connecting one end to one mounter and the other end to the other mounter so as to be rotatable about shafts substantially parallel to the columns. The mount bar supports an upper surface of the device within a space surrounded by the columns, and at least one of the one end and the other end is connected to a shaft so as to be movable in a direction connecting the shafts.

8 Claims, 13 Drawing Sheets

(56) References Cited

U.S. PATENT DOCUMENTS

| | | | |
|---|---|---|---|
| 9,769,947 B1* | 9/2017 | Sands | H05K 7/1491 |
| 10,182,511 B1* | 1/2019 | Chen | H05K 7/18 |
| 10,359,595 B2* | 7/2019 | Aramayo | G02B 6/4455 |
| 10,645,838 B2* | 5/2020 | Chen | H05K 7/1491 |
| 10,709,033 B2* | 7/2020 | Chen | H05K 7/1491 |
| 10,980,144 B2* | 4/2021 | Chen | H05K 7/1491 |
| 11,134,583 B2* | 9/2021 | Chen | H05K 7/1491 |
| 11,277,933 B2* | 3/2022 | Tower | H05K 7/183 |
| 11,464,127 B2* | 10/2022 | Gao | H05K 7/1417 |
| 11,709,330 B2* | 7/2023 | Chen | F16M 11/10 |
| | | | 211/96 |
| 2010/0039007 A1* | 2/2010 | Fan | H05K 7/1491 |
| | | | 312/223.2 |
| 2015/0342081 A1* | 11/2015 | Chang | H05K 7/18 |
| | | | 361/679.02 |
| 2019/0053396 A1* | 2/2019 | Chen | H02G 11/00 |

\* cited by examiner

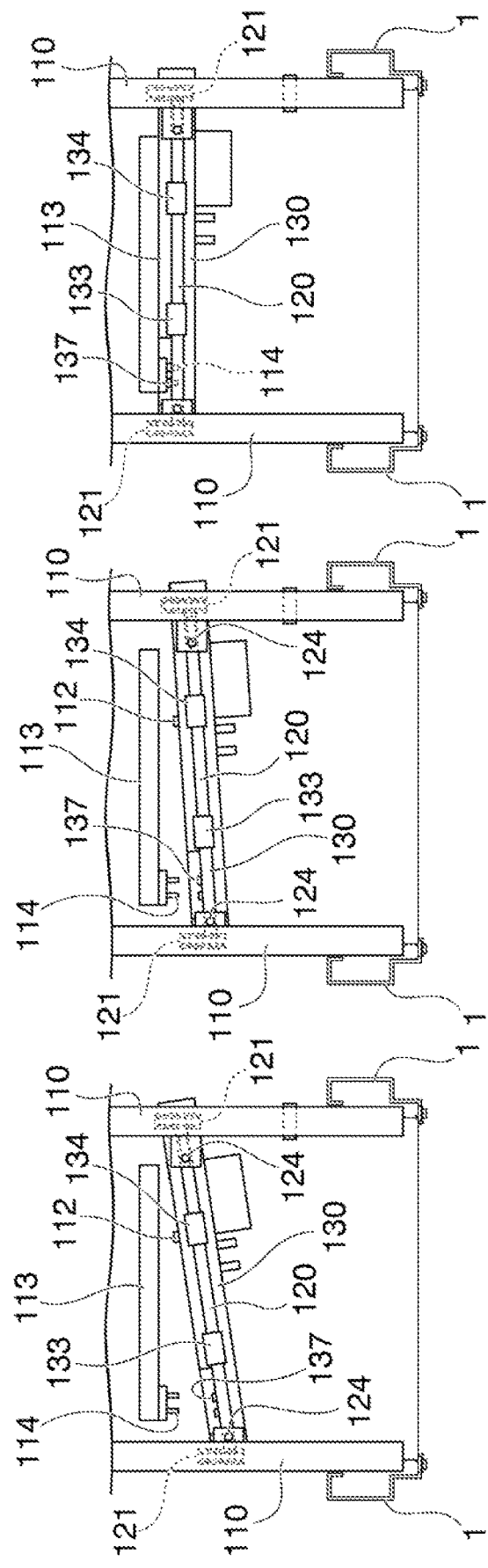

DEVICE MOUNTING MECHANISM AND DEVICE MOUNTING METHOD FOR RACK MOUNT

This application is based upon and claims the benefit of priority from Japanese patent application No. 2022-132228, filed Aug. 23, 2022, the disclose of which is incorporated herein in its entirety by reference.

TECHNICAL FIELD

The present disclosure relates to a device mounting mechanism and a device mounting method for a rack mount, whereby a device having a width larger than a frontage opening between columns can be mounted on a base provided inside the rack mount.

BACKGROUND ART

As a rack mount related to this application, a 19-inch rack defined by the EIA (Electronic Industries Association) standards is used.

Patent Document 1 (Japanese Unexamined Patent Application, First Publication No. 2021-129055) describes a technique related to such a rack mount.

An overview of the configuration of the rack mount described in Patent Document 1 will be described with reference to FIG. 13 to FIG. 16.

The rack mount 100 used here is an EIA standard 19-inch rack having a plurality of columns 1, a base 3 erected in an inner space of the columns 1, and a shelf board 10 installed horizontally on the columns 1.

As shown in FIG. 13B, a device M has a width (the width dimension is indicated by D2) that is larger than a frontage opening 2 between the columns 1 (the frontage dimension is indicated by D1).

In the following description with reference to FIG. 13 to FIG. 16, the width direction of the rack mount 100 is indicated by the x-axis, the depth direction by the y-axis, and the vertical direction by the z-axis.

As shown in FIGS. 13A and 13B, a device mounting mechanism 102 is provided with a holder 21 that holds the device M, and a link mechanism 22 provided so as to connect the holder 21 to the base 3 that is arranged so as to be vertical inside the columns 1 and is positioned at the rear, for rotatably supporting the holder 21 in a horizontal plane.

As shown in FIG. 13A to FIG. 16A, an upper portion of this holder 21 is provided with a slide groove portion 21A for holding the device M along the length direction.

The link mechanism 22 rotatably supports the holder 21 in the horizontal plane along the arrow A1-A2 direction, and has a first movable link LA and a second movable link LB with different lengths to each other.

The base ends of the first movable link LA and the second movable link LB are provided rotatably about two base-side vertical shafts a1 and b1, and are pivotally supported on fixed portions 30 and 31 that are positioned apart in the lateral direction (the x-axis direction of the rack mount 100) on the base 3.

The distal ends of the first movable link LA and the second movable link LB are rotatably provided about two holder-side vertical shafts a2 and b2 positioned on the holder 21 with an interval therebetween.

The length dimension of the first movable link LA is larger than that of the second movable link LB.

Moreover, the distal end of the first movable link LA is rotatably connected to an intermediate portion of the holder 21 via the holder-side vertical shaft a2. Furthermore, the distal end of the second movable link LB is rotatably connected to one end (right end in the figure) of the holder 21 via the holder-side vertical shaft b2.

Furthermore, the base-side vertical shafts a1, b1 and the holder-side vertical shafts a2, b2 rotatably support the movable links LA, LB with respect to the base 3 and the holder 21 via pins (not shown).

Moreover a connector 27A is installed on the surface of the base 3 side, and a connector 27B to be coupled to the connector 27A is provided on the device M set at the other end (left end in the drawing) of the holder 21 where the movable links LA and LB are not provided.

On the holder 21 side, the connector 27B is electrically connected to the device M when the device M is attached to the holder 21.

These connectors 27A and 27B are engaged with each other and electrically connected when the holder 21 rotates in the direction of arrow A2 and comes into contact with the base 3. Further, when the holder 21 rotates in the direction of arrow A1, and separates from the base 3, they are separated from each other.

In the device mounting mechanism 102 configured as described above, the first movable link LA and the second movable link LB having mutually different lengths are installed as the link mechanism 22. Moreover, the proximal end and the distal end of the first movable link LA and the second movable link LB are rotatably connected in the horizontal plane along the arrow A1-A2 direction via the base-side vertical shafts a1, b1 and the holder-side vertical shafts a2, b2. Therefore, by means of the link mechanism 22 as shown in FIGS. 13A and 13B, and FIGS. 14A and 14B, in the direction of the arrow A1, the holder 21 can be rotated and horizontally moved in the horizontal plane from the horizontal state with respect to the surface of the base 3 so as to become inclined or perpendicular.

Then, as shown in FIGS. 14A and 14B, when the holder 21 is inclined or perpendicular with respect to the surface of the base 3, the device M can be slid (in the direction of arrow C) along the slide groove 21A of the holder 21 and becomes detachable.

Furthermore, as shown in FIGS. 14A and 14B, and FIGS. 15A and 15B, in the direction indicated by the arrow A2, the holder 21 can be rotated and horizontally moved in the horizontal plane from the perpendicular state to give the parallel state.

Moreover, in the device mounting mechanism 102, after the holder 21 is rotated (rotated in the direction of arrow A2) in the horizontal plane (horizontally moved in the direction of arrow X1) and horizontally moved so that it is moved from the perpendicular state to the parallel state by the link mechanism 22, then as a final operation, as shown in FIGS. 15A and 15B, and FIGS. 16A and 16B, an operation of moving the holder 21 toward/away from the base 3 can be performed.

At this time, the holder 21 can move horizontally rearward as indicated by the arrow Y2 by each rotation of the first movable link LA and second movable link LB. Therefore, as shown in FIGS. 15A and 15B, and FIGS. 16A and 16B, the holder 21 can be moved toward and away from the base 3 while maintaining parallelism with the base 3.

SUMMARY

This disclosure has been made in view of the circumstances described above, with an object of providing a device mounting mechanism and a device mounting method that are capable of attaching and detaching a device to and from a rack mount while supporting the device, with a simple configuration.

In order to achieve the aforementioned objects, the present disclosure adopts the following configuration.

A device mounting mechanism according to the present disclosure is a device mounting mechanism that loads a device into an internal space within a plurality of columns constituting a rack mount, and includes: a pair of columns provided parallel to each other; mounters respectively supported by the pair of the columns so as to be movable in a direction intersecting a plane containing these columns; and a mount bar supported substantially horizontally by connecting one end to one mounter and the other end to the other mounter so as to be rotatable about shafts substantially parallel to the columns, and is characterized in that the mount bar supports an upper surface of the device within a space surrounded by the columns, and at least one of the one end and the other end is connected to a shaft so as to be movable in a direction connecting the shafts.

A device mounting method according to the present disclosure is device mounting method for a rack mount that loads a device into an area within a plurality of columns constituting the rack mount, and includes: rotatably supporting one end and the other end of a mount bar having a length substantially equal to the width of the area surrounded by the support, by means of mounters movable in the depth direction of the area; orienting the mount bar obliquely with respect to the depth direction within the area; attaching the device to the obliquely oriented mount bar along the mount bar; and rotating one end and the other end of the mount bar about shafts to thereby move the device in the depth direction while reducing the inclination of the device.

BRIEF DESCRIPTION OF THE DRAWINGS

FIG. 8A is a first top view showing the transition in a latter half of the operation of the device mounting mechanism of one embodiment.

FIG. 8B is a second top view showing the transition in a latter half of the operation of the device mounting mechanism of one embodiment.

FIG. 8C is a third top view showing the transition in a latter half of the operation of the device mounting mechanism of one embodiment.

EXAMPLE EMBODIMENT

Figure 1:
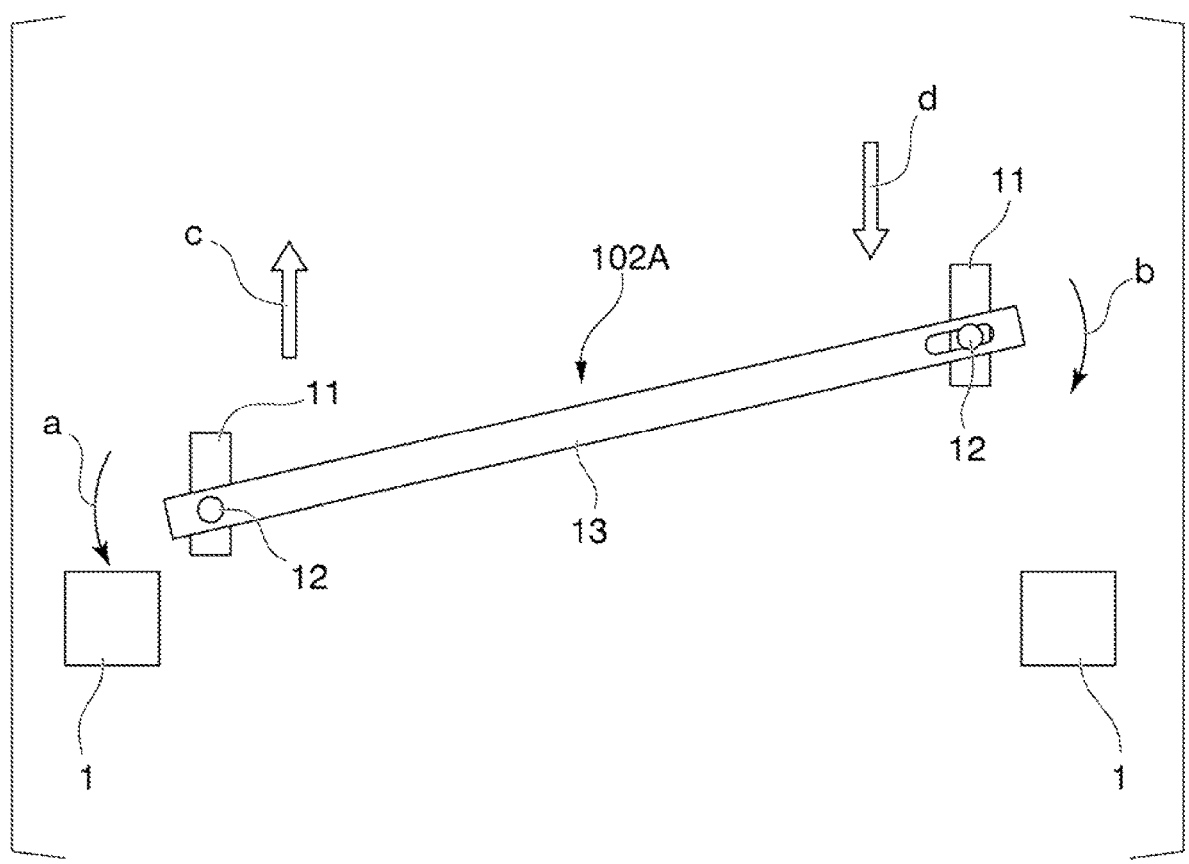
FIG. 1 is a plan view showing a device mounting mechanism for a rack mount according to a minimum configuration of the present disclosure.

A device mounting mechanism according to a minimum configuration of the present disclosure will be described with reference to FIG. 1.

A device mounting mechanism 102A for loading a device into an internal space within a plurality of columns 1 constituting a rack mount includes: a pair of columns 1 provided parallel to each other; mounters 11 supported by the pair of columns 1 so as to be movable in a direction intersecting a plane containing these columns 1; and a mount bar 13 supported substantially horizontally by connecting one end to one mounter 11 and the other end to the other mounter 11 so as to be rotatable about shafts 12 substantially parallel to the columns, and is characterized in that the mount bar 13 supports an upper surface of the device within a space surrounded by the columns 1, and at least one of the one end and the other end is connected to the shaft 12 so as to be movable in a direction connecting the shafts 12.

According to the above configuration, the mount bar 13 can rotate about the shafts 12 in the direction of arrow a or arrow b in FIG. 1, and the point of connection with the shafts 12 can be moved in the longitudinal direction. Therefore, the mount bar 13 can pass between the columns 1 in the direction of the arrow c or the opposite direction d, with the mount bar 13 being slanted with respect to a line segment connecting the columns 1. Further, by rotating the mount bar 13 about the shafts 12, then within the space inside the columns 1 (the area above the line segment connecting the columns 1 and 1 on the paper in FIG. 1), the device supported by the mount bar 13 can be supported in a parallel orientation, by arranging the mount bar 13 parallel to the line segment connecting the columns 1 and 1.

A device mounting mechanism according to one embodiment of the present disclosure will be described with reference to FIG. 2 to FIG. 10. In FIG. 2 to FIG. 10, the same components as in FIG. 1 are denoted by the same reference numerals to simplify the description.

Figure 2:
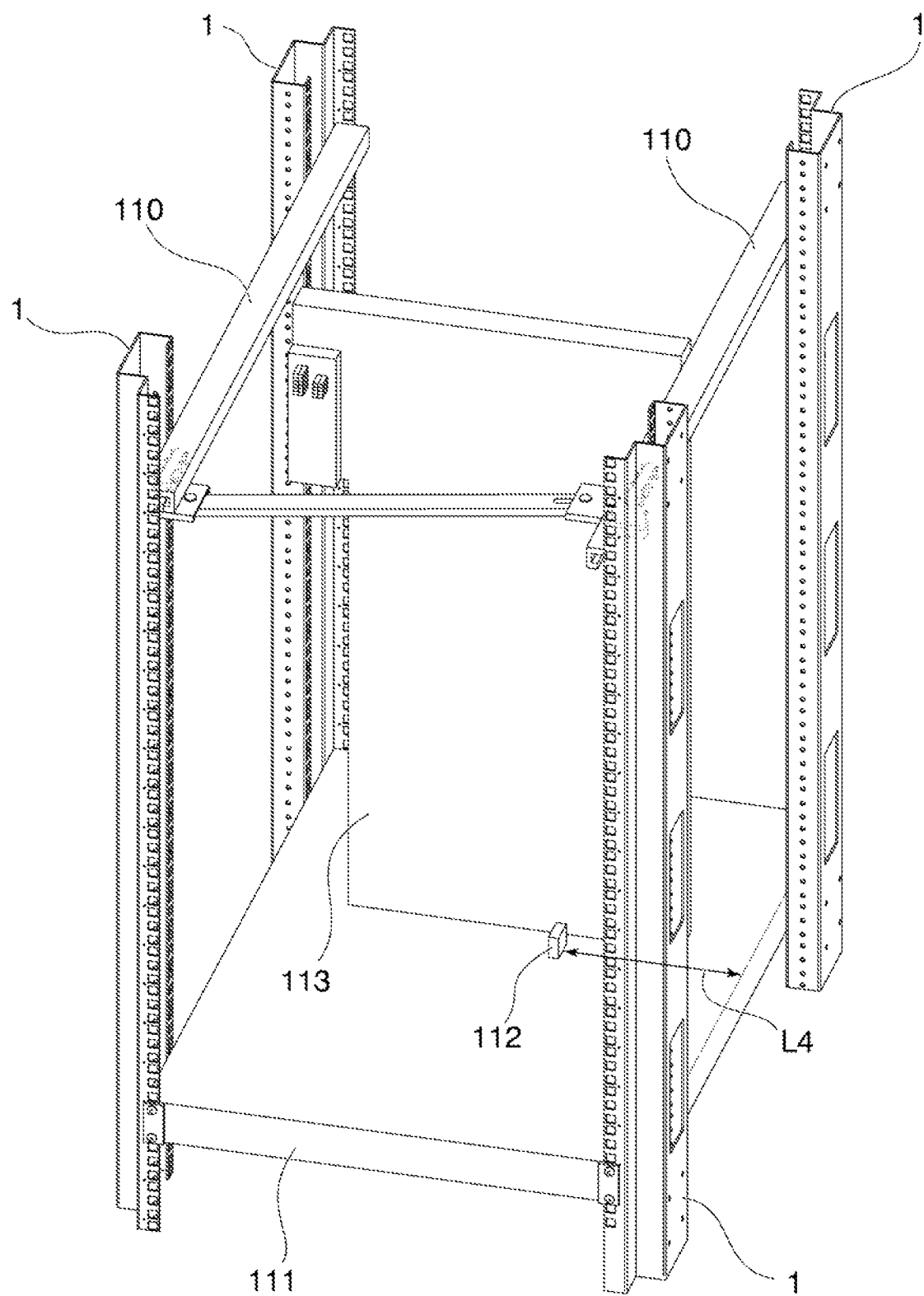
FIG. 2 is a perspective view showing the overall configuration of a device mounting mechanism for a rack mount according to one embodiment of the present disclosure.

FIG. 2 shows the appearance of the rack mount to which the device mounting mechanism is applied.

In the illustrated example, the inside of the four vertically arranged columns 1 is the device mounting area.

Hollow rod-shaped guide rails 110 are provided parallel to each other on the top of the columns 1 to connect the front and rear columns 1. Moreover, a plate-shaped base mount 111 is connected to the base ends of the columns 1, respectively. A guide member 112 protrudes upward at a predetermined position on an upper surface of the base mount 111, and guides the insertion direction of a device when operating the device is mounted using the guide rails 110. The guide function of the guide member 112 will be described later together with the operation of one embodiment. A flat plate-shaped base 113 is vertically provided at a position behind the guide member 112 (at the back of a rack) and supported by the base mount 111.

Figure 3:
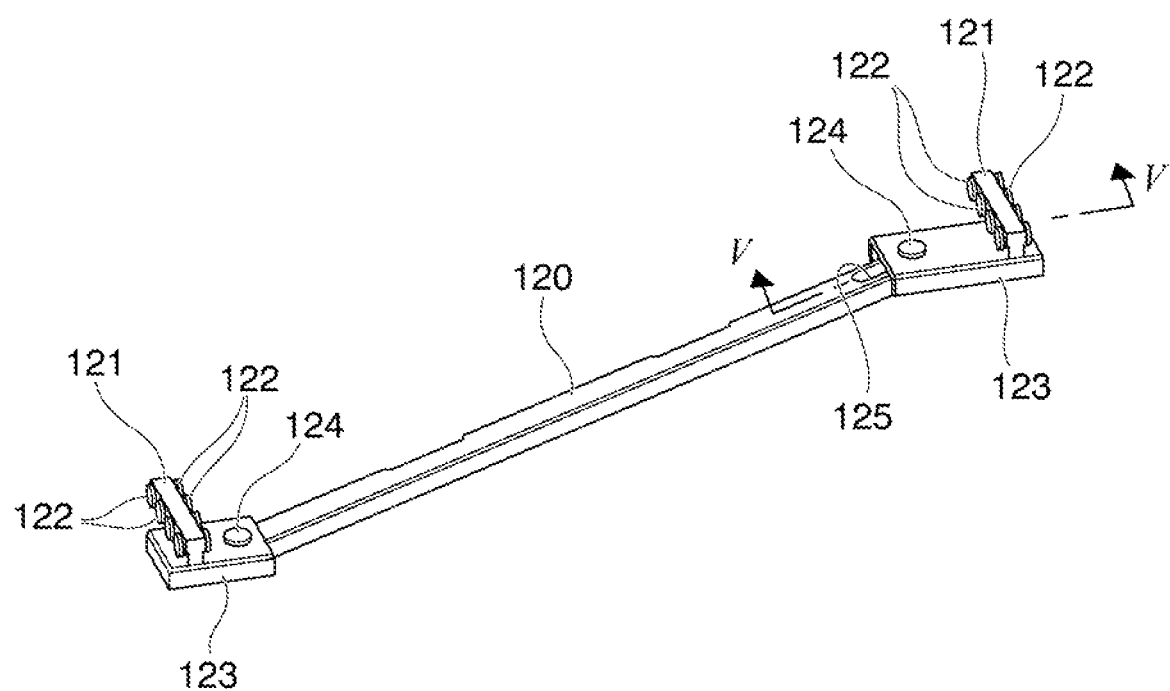
FIG. 3 is a perspective view of a mount bar portion in FIG. 2.

FIG. 3 shows the mount bar 120. The mount bar 120 is supported by mounters 121 supported by the guide rails 110, so as to be freely movable in the longitudinal direction (depth direction) of the rack mount.

Figure 5:
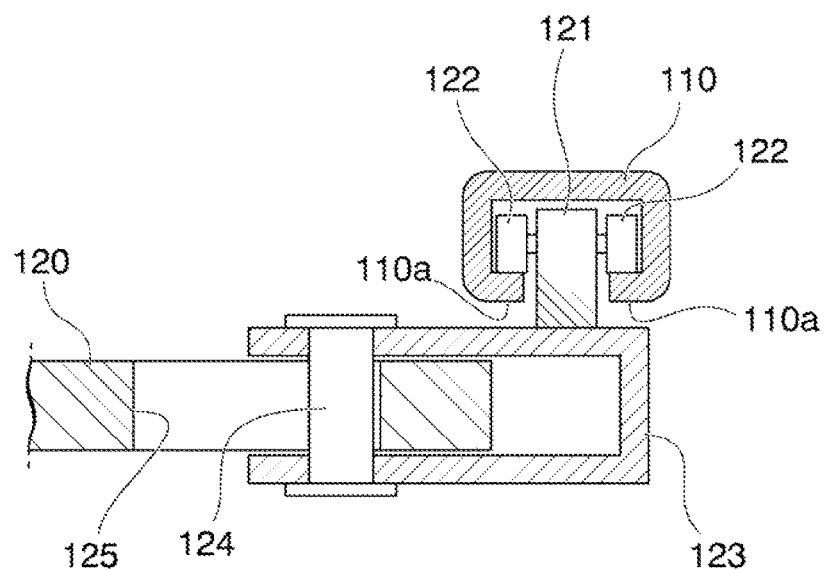
FIG. 5 is an enlarged arrow view along line V-V in FIG. 3.

The mounters 121 have a plurality of rollers 122 rotatable about a horizontal axis on each of one side and the other side. As shown in FIG. 5, the rollers 122 rotate along bottom ribs 110a of the guide rails 110, so that they can move along the guide rails 110 in the depth direction or opposite direction of the rack mount.

Support members 123 are arranged below the mounters 121 and vertically support the shafts 124 respectively.

The shaft 124 provided on one support member 123 of the pair of mounters 121 provided on each of the guide rails 110, rotatably supports one end (left side in FIG. 3) of the mount bar 120. Moreover, the shaft 124 provided on the other support member 123 of the mounter 121 rotatably supports the other end (right side in FIG. 3) of the mount bar 120. Furthermore, the point of connection of the other end of the mount bar 120 with the shaft 124 is provided with an elongated hole 125 extending in the longitudinal direction of the mount bar 120, and the shaft 124 is supported so as to be movable along the elongated hole 125.

Since the mounters 121 can move parallel to each other, the mount bar 120 supported by the above configuration is supported so that one end and the other end can move freely along the guide rails 110, and is rotatably supported about each shaft 124. Further, the other end of the mount bar 120 is further configured so that the shaft 124 can move within the elongated hole 125, and is therefore supported so that the rotation center can move along the longitudinal direction of the mount bar 120.

Figure 4:
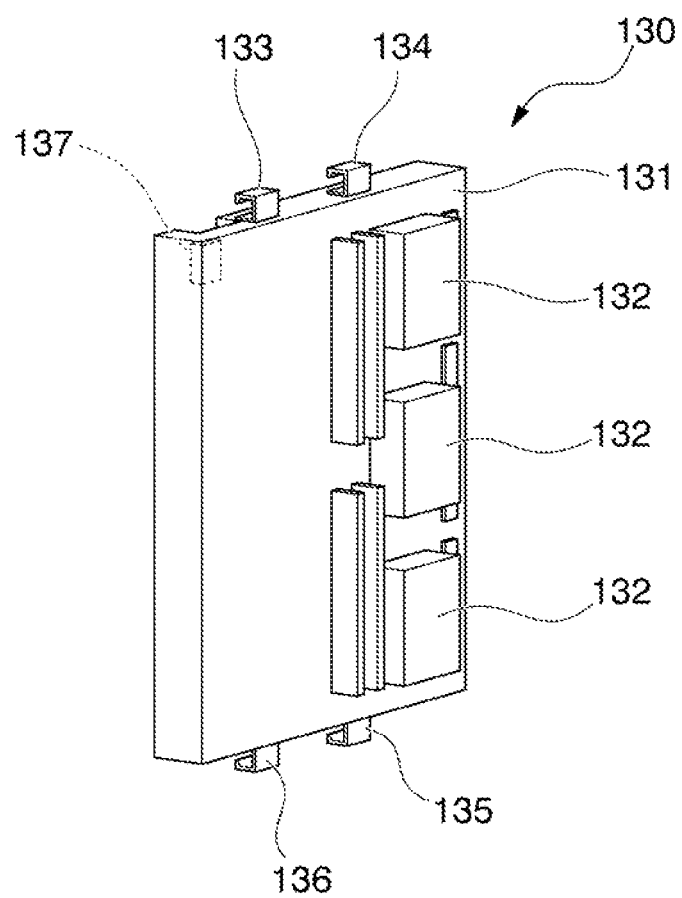
FIG. 4 is a perspective view of a device section in FIG. 2.

The configuration of a device 130 as a supported object supported by the mount bar 120 will be described with reference to FIG. 4.

The device 130 has a configuration in which electronic components 132 are mounted on the top surface (surface) of a substrate 131. The upper edge of the substrate 131 is provided with brackets 133 and 134 for attachment to the mount bar 120. Moreover, brackets 135 and 136 are provided on the lower edge of the substrate 131 so as to be symmetrical with the brackets 133 and 134. Note that the lower brackets 135 and 136 are set at a distance from the edge of the substrate 131, so that the relative position with the mount bar 120 is the same positional relationship as that of the upper brackets 133 and 134 when the device 130 is mounted upside down.

Moreover the lower brackets 135 and 136 are not only used for mounting in the case of arranging upside down as described above, but are also used as guided members that regulate parallelism of the base 113 with the substrate 131 due to contact with the guide member 112 on the upper surface of the base mount 111. How the lower bracket 135 or 136 functions as a guided member will be described in detail in the description of the operation of the embodiment with reference to FIG. 6 to FIG. 10 (especially FIGS. 10A to 10C).

A connector 137 to be connected to the connector 114 (see FIG. 6 and FIG. 8) provided on the base 113, is provided on the underside (rear surface) of the substrate 131.

Since the brackets 133 to 136 are detachably attached to the mount bar 120, they are constructed of elastically deformable material or provided with threaded holes for bolting, so that the mount bar 120 can be sandwiched against the upper edge (or the lower edge) of the substrate 131.

The operation of the device mounting mechanism of one embodiment having the above configuration will be described together with each step of device mounting.

Figure 6A:
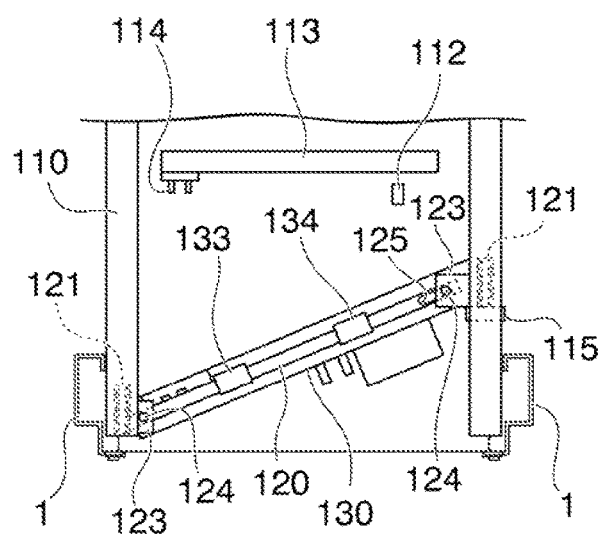
FIG. 6A is a first top view showing the transition in a first half of the operation of the device mounting mechanism of one embodiment.
Figure 7A:
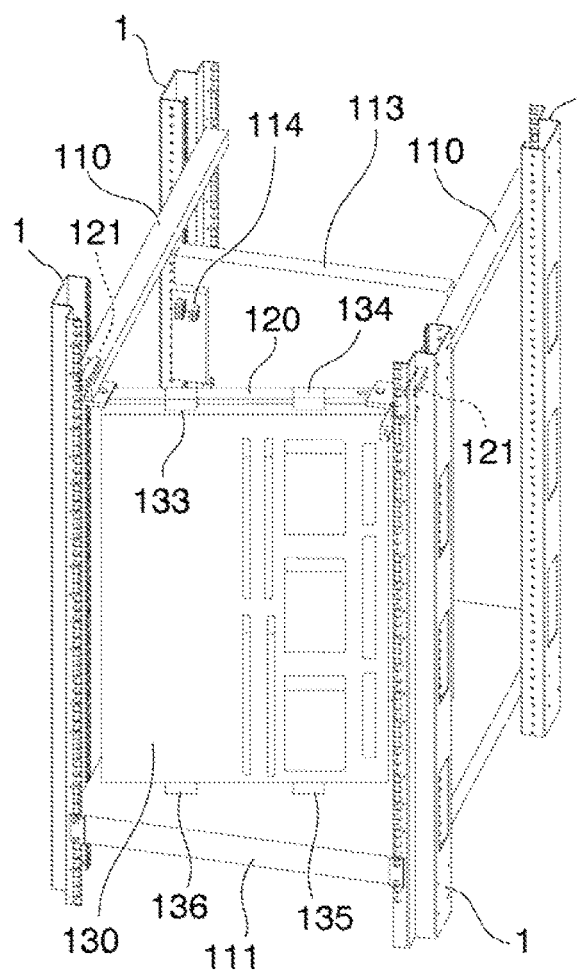
FIG. 7A is a perspective view of the operation shown in FIG. 6A as seen obliquely from above.

As shown in FIG. 6A and FIG. 7A, by shifting the positions of the mounters 121 on one guide rail 110 and the other guide rail 110 (positions in the depth direction in the drawing), the mount bar 120 supported by these mounters 121 is arranged obliquely.

During this operation, the shaft 124 supported by the mounter 121 on the right side in the drawing can move within the elongated hole 125, so that the mount bar 120 can be obliquely arranged at a predetermined angle.

The device 130 is oriented obliquely to the extent that it can pass through the space between the front columns 1 and 1, and is passed between the columns 1 and 1. The device 130 is attached to the mount bar 120 by hooking the brackets 133 and 134 to the mount bar 120.

The operation of bringing the device 130 into the area surrounded by the plurality of columns 1 and attaching it to the mount bar 120 is performed while the operator holds the device 130 by hand. However it can be easily completed by hooking and fixing the brackets 133 and 134 to the mount bar 120 without intruding too much to the back of the area surrounded by the columns 1.

Figure 6B:
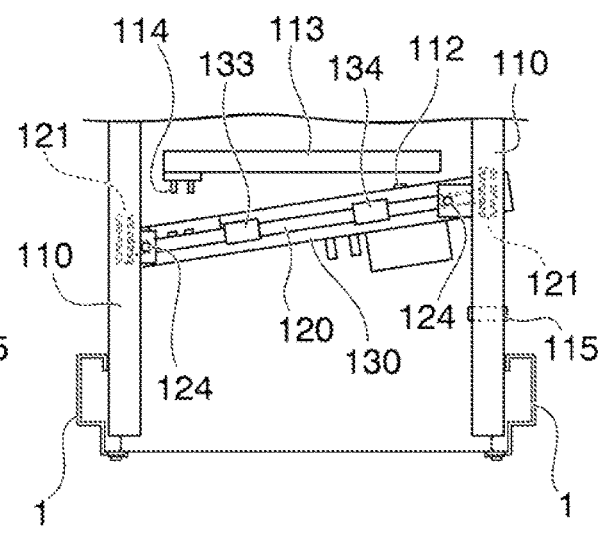
FIG. 6B is a second top view showing the transition in a first half of the operation of the device mounting mechanism of one embodiment.
Figure 7B:
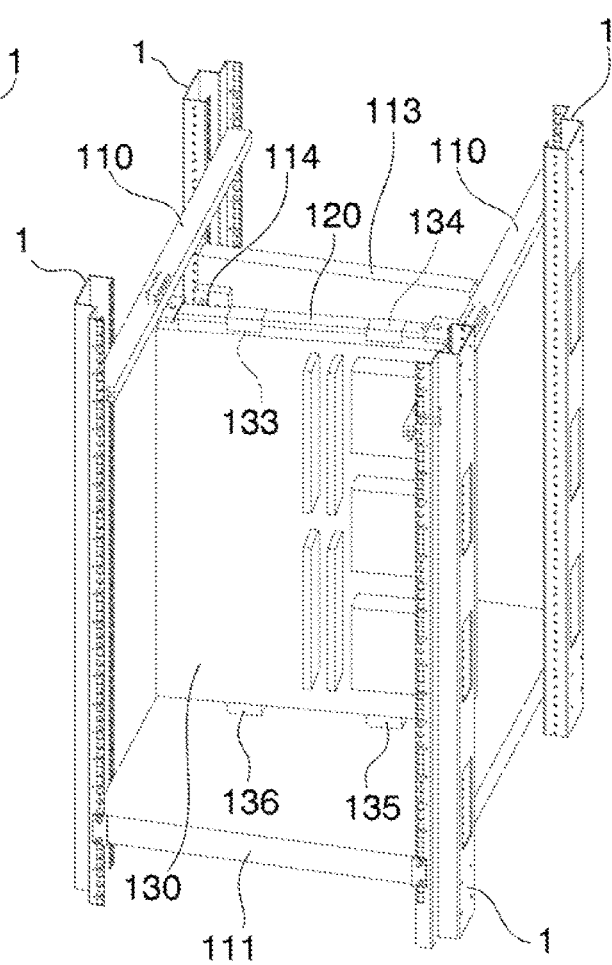
FIG. 7B is a perspective view of the operation shown in FIG. 6B as seen obliquely from above.

With the device 130 attached to the mount bar 120, then while pushing one end (left side) of the mount bar 120 farther than the other end (right side), as shown in FIG. 6B and FIG. 7B, the device 130 is brought closer to the base 113. During this operation, one end of the mount bar 120 (the left end in the drawing) rotates about the shaft 124, and the other end of the mount bar 120 (the right end in the drawing) moves into the elongated hole 125 while rotating about the shaft 124.

After the device 130 supported by the mount bar 120 reaches the position shown in FIG. 6B and FIG. 7B, then while adjusting the inclination of the device 130, the device 130 is moved in the depth direction while being positioned with respect to the base 113, until the connector 114 and the connector 137 are oriented so that they can be mated (the terminal conductors built in the connectors 114 and 137 face each other).

The operation of the device mounting mechanism in the final stage of alignment and attachment of the device 130 will be described with reference to FIGS. 8 to 10.

Figure 9A:
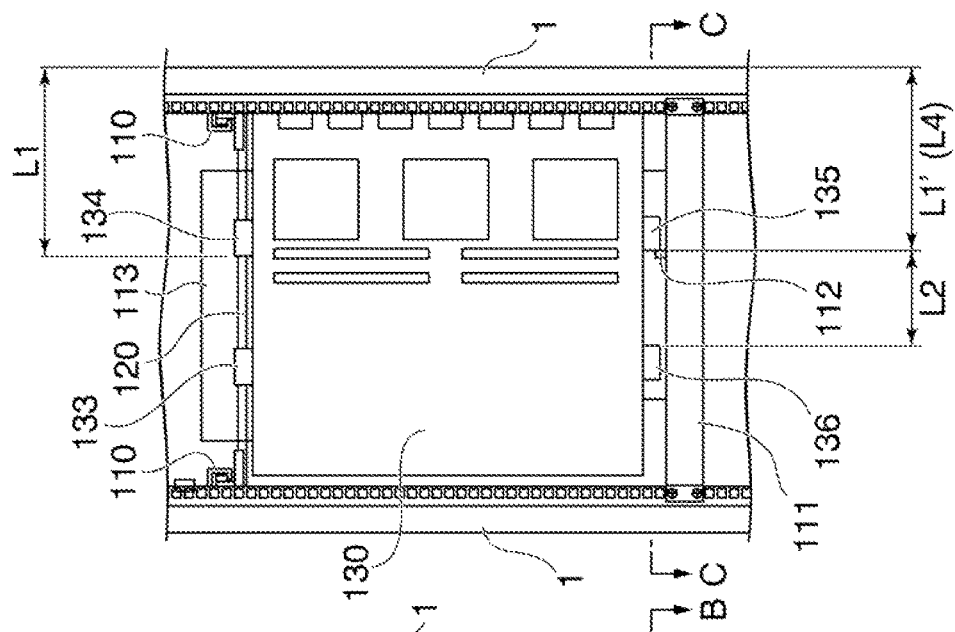
FIG. 9A is a front view showing the operation shown in FIG. 8A.

In the position indicated by FIG. 8A and FIG. 9A, the device 130 is oriented obliquely with respect to the base 113 (the direction where one end on the left side in the drawing is further away from the base 113 than the other end on the right side), and the connectors 114 and 137 do not face each other. In other words, it is not in a mating orientation.

Figure 9B:
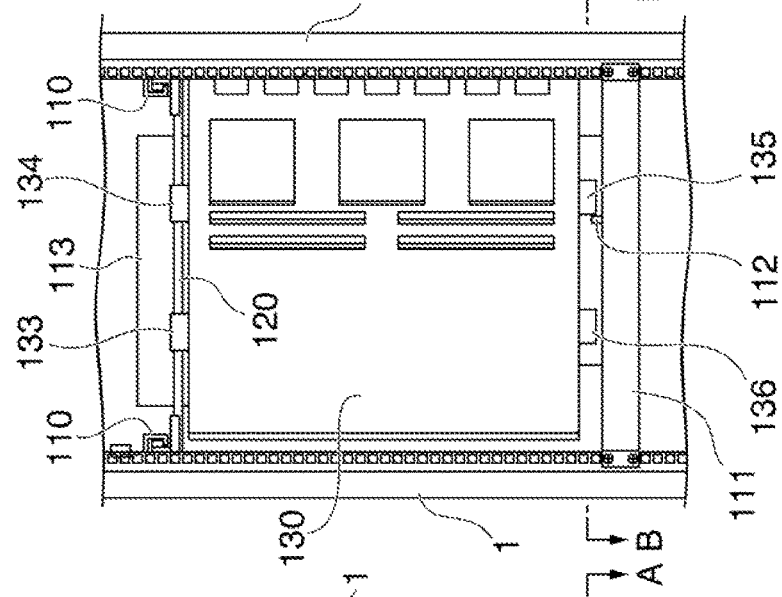
FIG. 9B is front a view showing the operation shown in FIG. 8B.
Figure 9C:
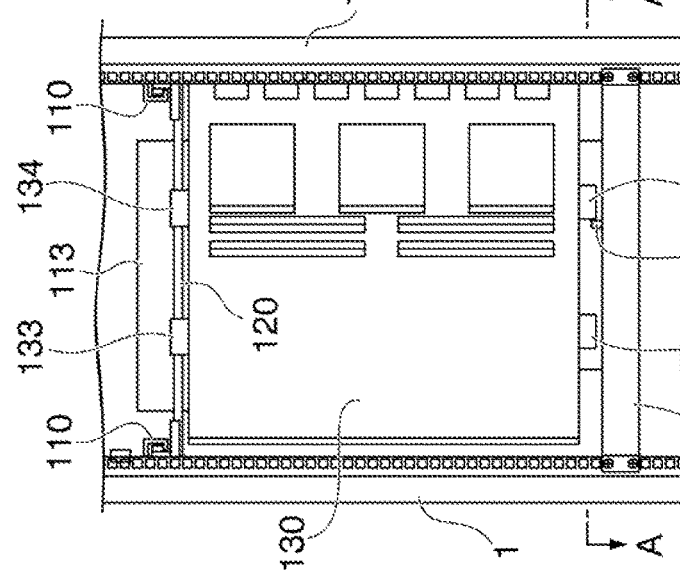
FIG. 9C is front a view showing the operation shown in FIG. 8C.
Figure 10A:
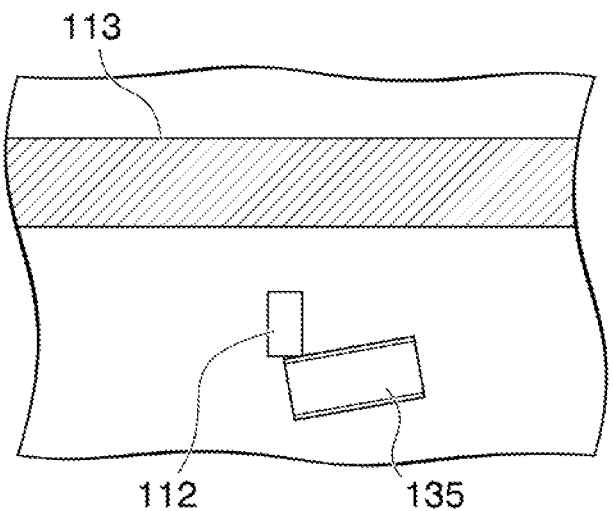
FIG. 10A is an explanatory diagram of the relative positions of the bracket and the guide in the transition operation shown in FIG. 8A.

At such an angle, as shown in FIG. 10A, the guide member 112 on the base mount 111 comes into contact with the bracket 135 at the bottom of the device 130 (the positions in the left-right direction in FIGS. 8 to 10 overlap). Therefore, the device 130 and the mount bar 120 supporting it, cannot be moved further (in the direction in which the connector 114 approaches) from the state shown in FIG. 8A to FIG. 10A.

When the mount bar 120 is further rotated centered on the left shaft 124 to an angle more nearly parallel to the base 113, then as shown in FIG. 8B to FIG. 10B, the length where the guide member 112 on the base mount 111 contacts the bracket 135 at the bottom of the device 130 (overlapping positions in the left right direction in FIG. 8B to FIG. 10B) becomes smaller than the state shown in FIG. 8A to FIG. 10A. However, since the bracket 135 is still in contact with the guide member 112, the device 130 and the mount bar 120 that supports it cannot be moved further (in the direction in which the connector 114 approaches) from the state shown in FIG. 8B to FIG. 10B.

When the mount bar 120 is further rotated centered on the left shaft 124 to give the angle shown in FIG. 8C to FIG. 10C, it becomes parallel to the base 113. More specifically, since this gives a condition where the guide member 112 on the base mount 111 does not come into contact with the bracket 135 at the bottom of the device 130 (the position in the left-right direction in FIG. 8C to FIG. 10C does not overlap), the device 130 and the mount bar 120 supporting it can be moved from the state shown in FIG. 8B to FIG. 10B to the state shown in FIG. 8C to FIG. 10C (in the direction in which the connector 114 approaches).

That is, the device 130 is placed in a position substantially parallel to the base 113 within the rack mount, and while the mounter 121 is slid along the guide rail 110 in this state, the mount bar 120 is moved parallel in the depth direction, and the device 130 integrally supported by the mount bar 120 is brought closer to the base 113, and the connector 137 is inserted into the connector 114. By connecting the connectors 114 and 137 in this way, the mounting of the device 130 in the rack mount is completed, and the device 130 is electrically connected to the rack mount side (to other devices mounted on the rack mount).

The positional relationship between the bracket 135 and the guide member 112 for guiding when the device 130 is attached by contact between the guide member 112 and the bracket 135 serving as a guided member shown in FIGS. 8 to 10 will be described.

Since the guide member 112 is arranged on the base mount 111, its position (distance from one side of the right side of the base mount 111) is set to L1 as shown in FIG. 9C. On the other hand, the position of the bracket 135 serving as a guided member is set so that the distance from one side of the substrate 131 constituting the device 130 becomes L2. In the embodiment shown in FIGS. 9A to 9C, since the bracket 135 is arranged below the substrate 131 together with the bracket 136, it does not function as a member for fixing to the mount bar 120, while the brackets 133 and 134 serve a function for fixing to the mount bar 120. In addition, the distance between the brackets 133 and 134 and the distance between the brackets 135 and 136 are determined in consideration of the stability of attachment to the mount bar 120, and so that the bracket 136 is arranged at a position where it does not interfere with the guide member 112 (the locus of movement of the bracket 136 accompanying the movement of the mount bar 120 does not overlap the guide member 112) when the bracket 135 functions as a guided member.

Also, the positions of the brackets 134 and 135 are arranged at the same distance as the brackets 135 and 136 in consideration of the case where the device 130 is installed by reversing it. When the connectors 114 and 137 shown in FIG. 9B to FIG. 9C are fitted, then by setting the distance L1' between the right side surface of the column 1 and the left side surface of the bracket 135 (equal to the distance L1 between the left side of the symmetrically arranged upper bracket 134 and the right side of the column 1), to be equal to or slightly less than the distance L4 between the right side surface of the column 1 and the right side surface of the guide member 112, then a procedure is possible where the equipment 130 as shown in FIGS. 8A to 8C, FIGS. 9A to 9C, and FIGS. 10A to 10C, is passed between the pillars 1, 1 while being inclined, and installed while reducing the inclination after passing. Further, the distance L2 between the right side surface of the bracket 133 and the left side surface of the bracket 134 (the distance between the left side surface of the bracket 135 and the right side surface of the bracket 136), is set to a position where, during the transitions of FIGS. 10A, 10B to 10C above, the bracket 135 does not interfere with the guide member 112 (the locus of movement of the bracket 135 accompanying the movement of the mount bar 120 does not overlap the guide member 112).

The distances L1 and L1' are specified by the mounting positions of the brackets 133 to 136 on the mount bar 120 (where in the longitudinal direction of the mount bar 120 the brackets 133 to 136 are hooked or sandwiched). However, these attachment position of the brackets to the mount bar 120 can also be adjusted by sliding in the longitudinal direction of the mount bar 120. That is, the distance L1 and the like can be changed according to errors in mounting positions of the brackets 133 to 136 on the substrate 131, and usage conditions.

Figure 10B:
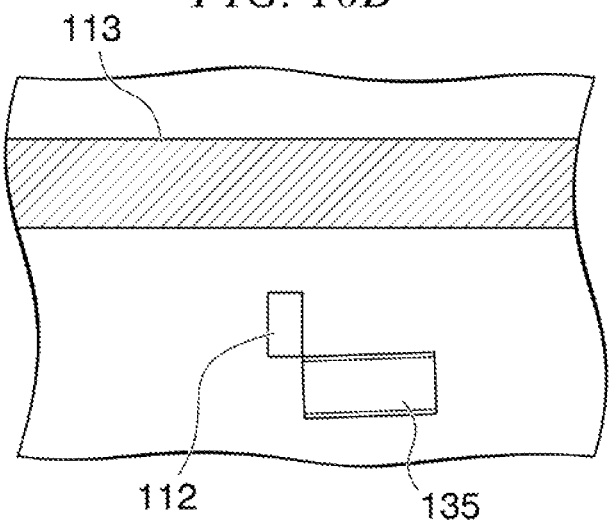
FIG. 10B is an explanatory diagram of the relative positions of the bracket and the guide in the transition operation shown in FIG. 8B.
Figure 10C:
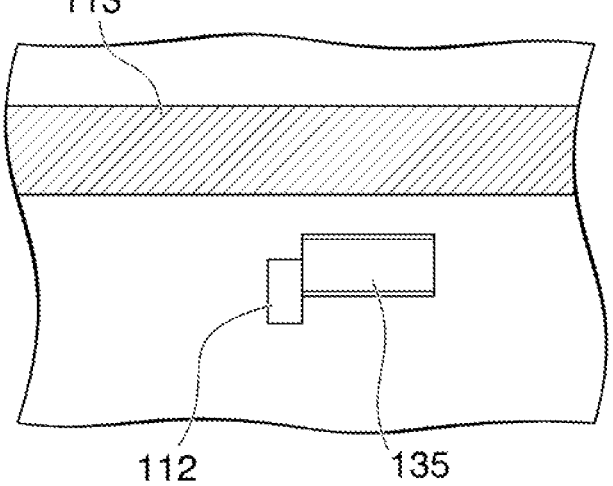
FIG. 10C is an explanatory diagram of the relative positions of the bracket and the guide in the transition operation shown in FIG. 8C.

As preparation work for a series of operations for attaching the device 130 to the mount bar 120, the mounting position of the device 130 in the longitudinal direction of the mount bar 120 is determined so that the bracket 135 is arranged at the position shown in FIG. 10C. Then the guide member 112 is fixed at a position adjacent to the left side surface of the bracket 135. As a result attachment to a predetermined position is possible by moving as shown in FIGS. 10A to 10C.

Further, regarding the brackets 133 and 134 and the brackets 135 and 136 of the device 130, when the device 130 is turned upside down the lower bracket 133 or 134 can be used as a guided member, and the device 130 can be mounted in a predetermined position in a manner similar to that shown in FIGS. 8 to 10.

As described above, the mount bar 120 is slanted with respect to the base 113, and the device 130 wider than the opening of the rack mount is attached, and is moved in the depth direction while being rotated so as to become parallel to the base 113. By so doing, the device 130 can be rack-mounted and the connectors 114 and 137 can be connected.

Figure 11:
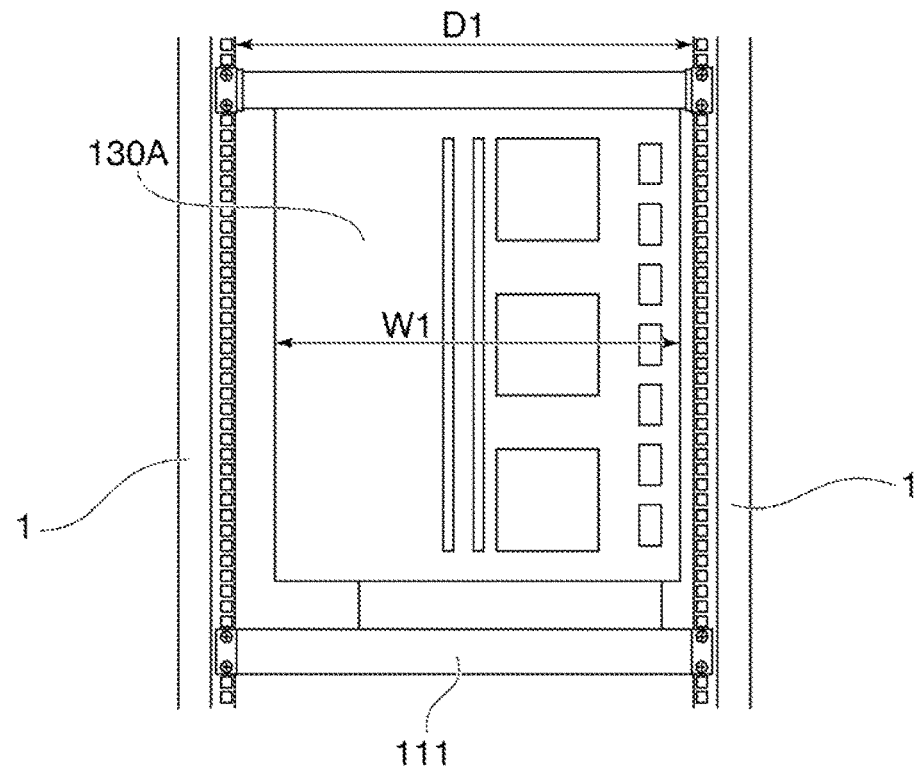
FIG. 11 is a front view of a Comparative Example 1 of a device mounting on a rack mount.

On the other hand, as in a Comparative Example 1 shown in FIG. 11, when the width W1 of the device 130A is sufficiently smaller than the frontage D1 of the opening, which is the distance between the inner surfaces of the right column 1 and the left column 1, the device 130A can be brought into the back of the rack mount without inclination. Therefore, although the device mounting mechanism according to the one embodiment is not necessarily required, since the device 130A mounted in the area surrounded by the plurality of columns 1 constituting the rack mount is small, the space inside the rack mount cannot be effectively utilized.

Figure 12:
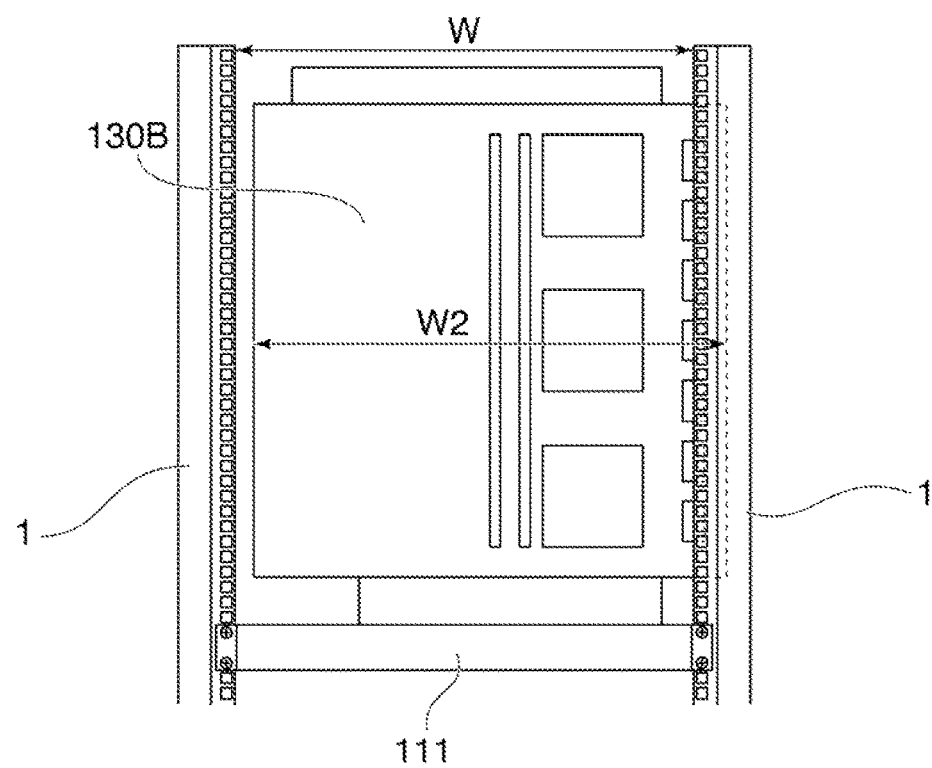
FIG. 12 is a front view of a Comparative Example 2 of a device mounting on a rack mount.
Figure 13A:
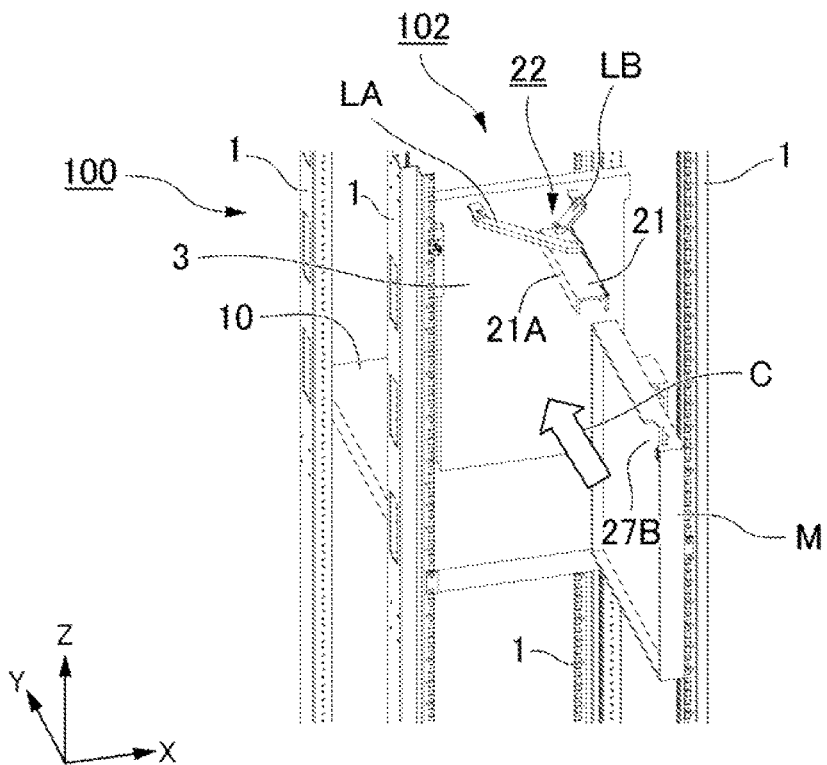
FIG. 13A is a first explanatory diagram of a stage before device setting in one conventional example of a device mounting mechanism for a rack mount.
Figure 13B:
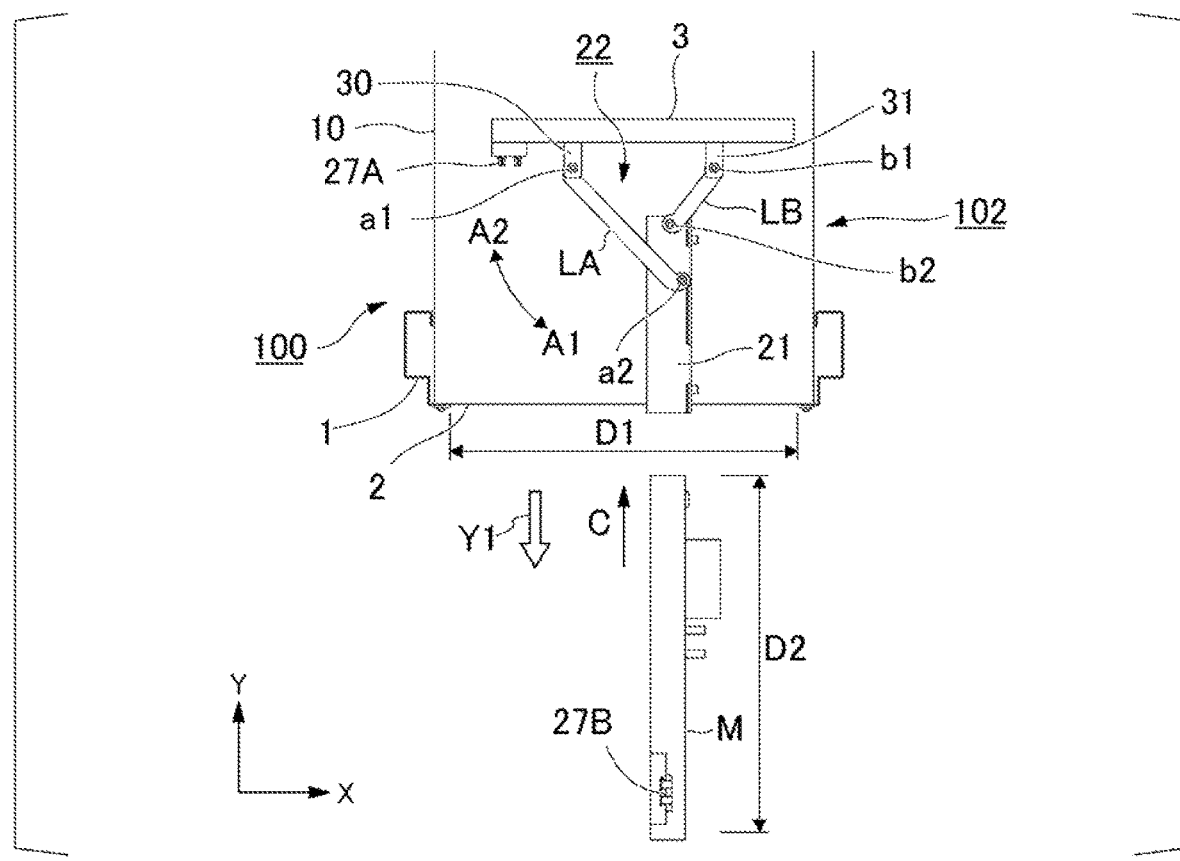
FIG. 13B is a second explanatory diagram of a stage before device setting in one conventional example of a device mounting mechanism for a rack mount.
Figure 14A:
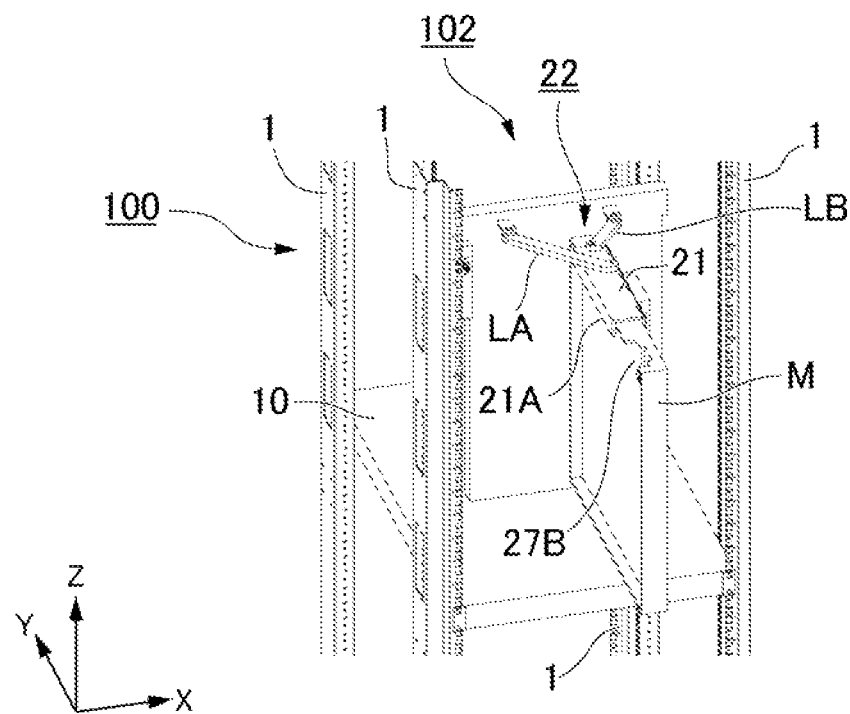
FIG. 14A is an explanatory diagram of the device mounting mechanism in FIG. 13A at a stage after the device is set.
Figure 14B:
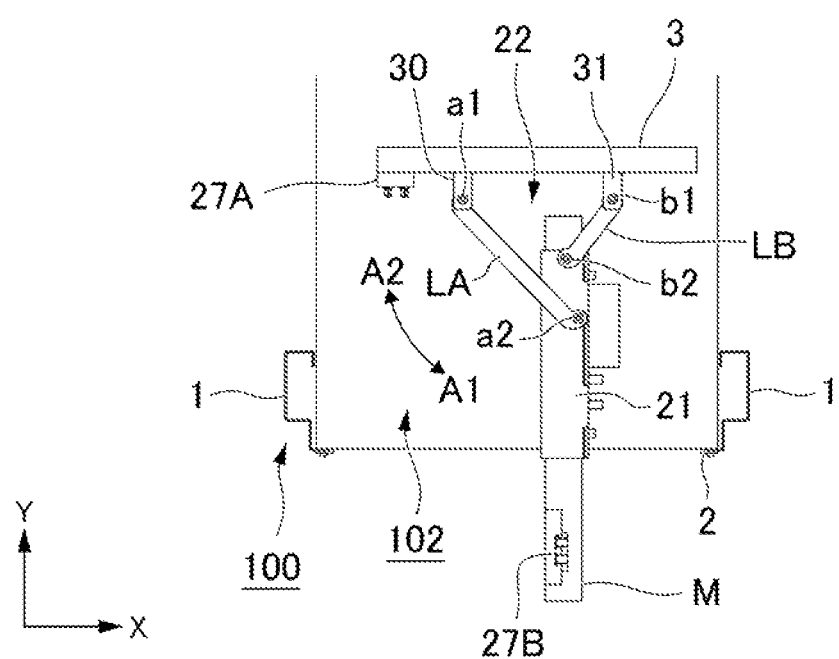
FIG. 14B is an explanatory diagram of the device mounting mechanism in FIG. 13B at a stage after the device is set.
Figure 15A:
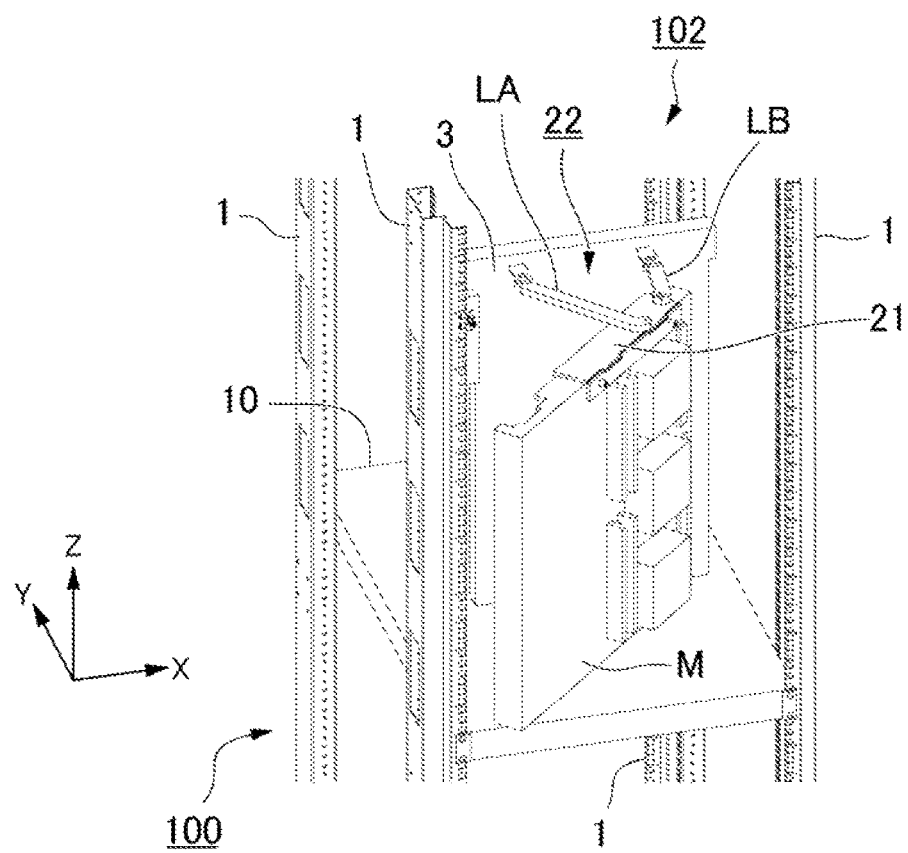
FIG. 15A is an explanatory diagram of a stage in which the device mounting mechanism of FIG. 13A is obliquely pushed in after the device is set.
Figure 15B:
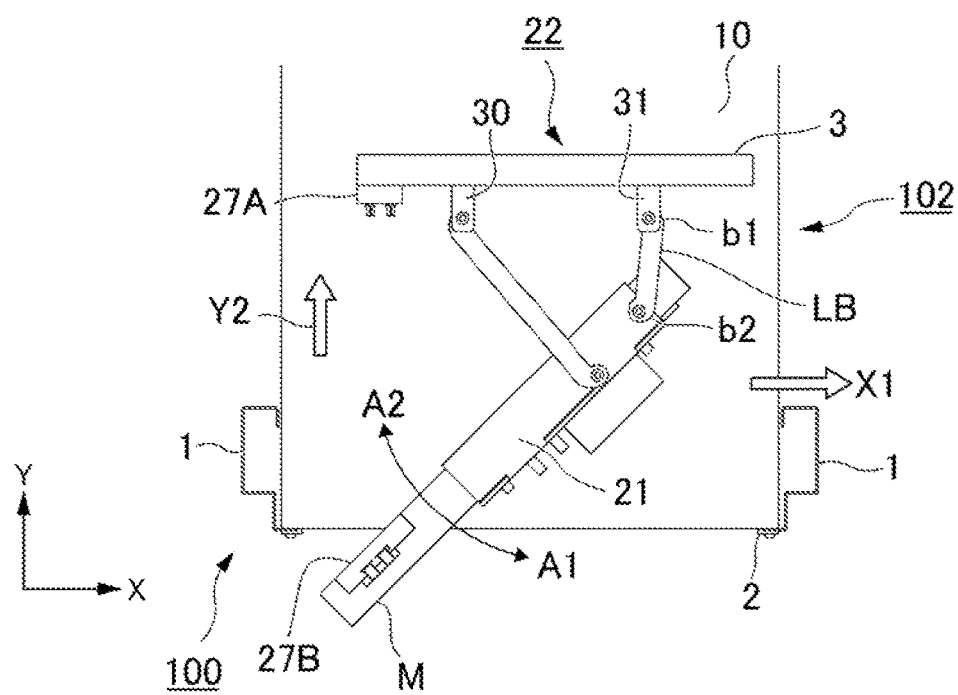
FIG. 15B is an explanatory diagram of a stage in which the device mounting mechanism of FIG. 13B is obliquely pushed in after the device is set.
Figure 16A:
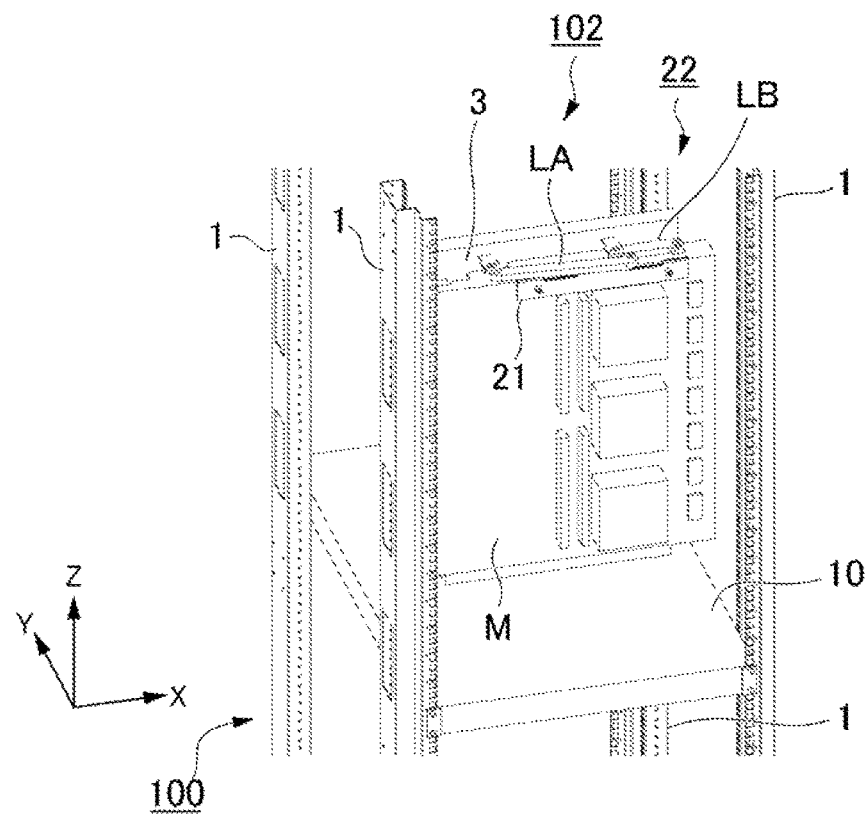
FIG. 16A is an explanatory diagram of the final stage of device mounting of the device mounting mechanism of FIG. 13A.
Figure 16B:
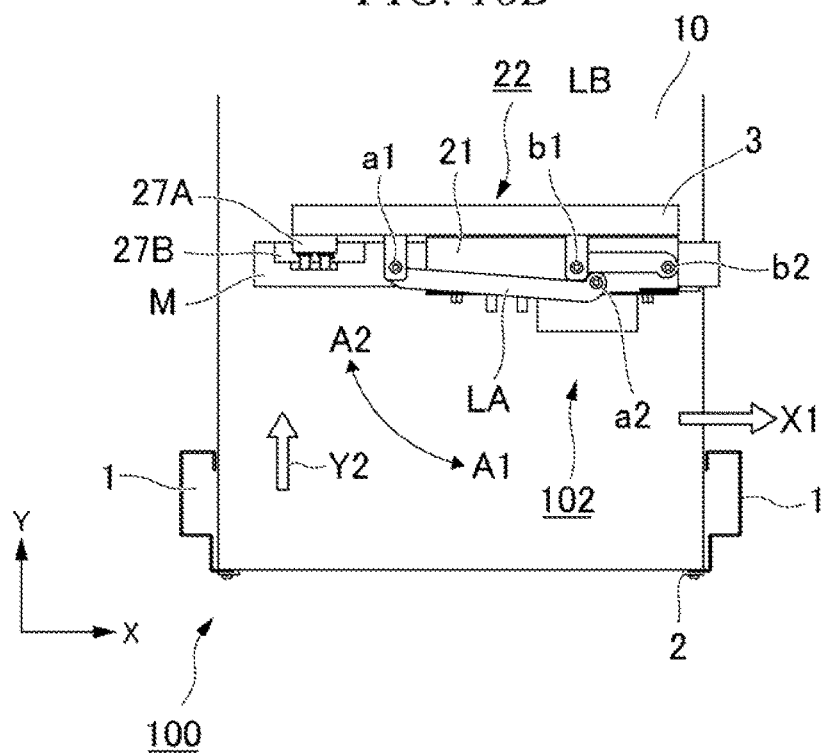
FIG. 16B is an explanatory diagram of the final stage of device mounting of the device mounting mechanism of FIG. 13B.

Also, as in a Comparative Example 2 shown in FIG. 12, when the width W2 of the device 130B is slightly larger than the frontage D1 of the opening, which is the distance between the inner surfaces of the right column 1 and the left column 1, that is, when the right side of the device 130B is positioned outside the left side of the right column 1 as indicated by the dashed line in the figure, then for example, the device 130B can be brought into the back of the rack mount while being inclined, by the device mounting mechanism provided with the link described in the conventional example. However in order to obtain the strength required for the device mounting mechanism, which is the problem to be solved by the present application, then for example, in a cantilevered support structure such as the device mounting mechanism disclosed in Patent Document 1, it is inevitable that the members constituting the device mounting mechanism, or the support members thereof become larger than those in the aspect of the one embodiment.

Thus, in the one embodiment, the device 130 supported by the mount bar 120 can pass obliquely between the columns 1 by turning the mount bar 120 centered on the shafts 124. After that, the device 130 can be carried in to a predetermined position and attached while facing in a substantially parallel direction in which the connectors 114 and 137 can be fitted. Since the mount bar 120 has a structure in which one end and the other end are supported centered on the shafts 124, the device mounting mechanism can be configured with relatively lightweight members.

As a configuration for supporting both ends of the mount bar 120 so as to be movable in the depth direction, a mechanism that replaces the support of the mounters 121 by the guide rails 110 may be adopted.

Also, the length and shape of the mount bar 120, the shape of each part constituting the device 130, and the like are not limited to the one embodiment described above.

In the device mounting mechanism described in Patent Document 1, the construction is such that the members such as the first link LA and the second link LB that constitute the link mechanism 22, are supported in a cantilevered state by the fixing portions 30 and 31 and protrude. Therefore, in order to move the device M while maintaining it horizontally, it is necessary to increase the thickness of the members such as the first link LA and the second link LB of the link mechanism 22, or the fixing portions 30 and 31, to increase the rigidity of the entire mechanism 22, which makes it difficult to reduce the thickness of the device mounting mechanism. As a result, there is a problem in that the device mounting mechanism becomes large, and the effective space available for storage inside the rack mount becomes small.

According to the present disclosure, for example, within an area surrounded by a plurality of columns, the mount bar whose both ends are rotatably supported, can be moved to the back of the area while being rotated, and both ends of the mount bar are supported. Therefore, it is possible to reduce the weight and size of the device mounting mechanism.

In the above, one embodiment of the present disclosure has been described in detail with reference to the drawings, but the specific configuration is not limited to this one embodiment, and design changes and the like not departing from the scope of the present disclosure are also included.

Accordingly, the disclosure is not to be considered as being limited by the foregoing description, and is only limited by the scope of the appended claims.

INDUSTRIAL APPLICABILITY

The present disclosure can be used to mount a device on a server rack on which electronic devices such as servers are mounted.

What is claimed is:

1. A device mounting mechanism for a rack mount that loads a device into an internal space within a plurality of columns constituting the rack mount, the device mounting mechanism comprising:
   a pair of columns provided parallel to each other;
   mounters respectively supported by the pair of columns so as to be movable in a direction intersecting a plane containing the pair of columns; and
   a mount bar supported substantially horizontally by connecting one end to one mounter and the other end to the other mounter so as to be rotatable about shafts substantially parallel to the columns, wherein
   the mount bar supports an upper surface of the device within a space surrounded by the columns, and a rotation center of one of the shafts to which at least one of the one end and the other end of the mount bar is connected and which is movable in a direction connecting the shafts, while the one end and the other end of the mount bar are connected to each mounter rotatably about each shaft.

2. The device mounting mechanism for a rack mount according to claim 1, wherein
   the mounters are supported so as to be freely movable along each of a pair of parallel guide rails which are supported in a direction intersecting one plane including a pair of adjacent columns among the plurality of columns, and
   the mount bar is supported by the shafts provided on the mounters.

3. The device mounting mechanism for a rack mount according to claim 1, wherein an elongated hole is provided at either one end or the other end of the mount bar, for supporting one of the shafts so as to be freely rotatable and freely movable in the longitudinal direction of the mount bar.

4. The device mounting mechanism for a rack mount according to claim 1, wherein a bracket provided on a top of the device is hooked to the mount bar between one end and the other end to support the device.

5. The device mounting mechanism for a rack mount according to claim 1, wherein a guide member is provided in a movement area of the device below the mount bar to regulate the orientation of the device in a predetermined direction by contacting a guided member installed on the bottom of the device.

6. A device mounting method for a rack mount that loads a device into an area within a plurality of columns constituting the rack mount, the device mounting method comprising:

rotatably supporting one end and the other end of a mount bar having a length substantially equal to the width of the area surrounded by the columns, by mounters movable in the depth direction of the area;

orienting the mount bar obliquely with respect to the depth direction within the area;

attaching the device to the obliquely oriented mount bar along the mount bar; and rotating one end and the other end of the mount bar about shafts, wherein a rotation center of one of the shafts to which at least one of the one end and the other end of the mount bar is connected and which is movable in a direction connecting the shafts, while the one end and the other end of the mount bar are connected to each mounter, to move the device in the depth direction while reducing an inclination of the device with respect to a member to which the device is attached.

7. The device mounting method for a rack mount according to claim 6, wherein:

the mounters are movably supported along a pair of guide rails arranged along the depth direction within the plurality of columns, and one end and the other end of the mount bar are rotatably supported by shafts supported by the mounter.

8. The device mounting method for a rack mount according to claim 6, further comprising:

determining a mounting position of the device in the longitudinal direction of the mount bar, before attaching the device to the mount bar.

* * * * *